(12) United States Patent
Chuang

(10) Patent No.: US 6,717,176 B1
(45) Date of Patent: Apr. 6, 2004

(54) WHITE LIGHT EMITTING ORGANIC ELECTRO-LUMINESCENT DEVICE AND METHOD FOR FABRICATING THE SAME

(75) Inventor: Feng-Ju Chuang, Hsinchu (TW)

(73) Assignee: Opto Tech Corporation, Hsinchu (TW)

( * ) Notice: Subject to any disclaimer, the term of this patent is extended or adjusted under 35 U.S.C. 154(b) by 0 days.

(21) Appl. No.: 10/291,489

(22) Filed: Nov. 12, 2002

(51) Int. Cl.⁷ .................... H01L 35/24; H01L 51/00
(52) U.S. Cl. ................. 257/40; 257/72; 257/103; 257/59; 257/347; 428/690
(58) Field of Search .............. 257/40, 72, 103, 257/59, 347; 428/690

(56) References Cited

U.S. PATENT DOCUMENTS

| | | | | |
|---|---|---|---|---|
| 5,294,870 A | * | 3/1994 | Tang et al. | 313/504 |
| 5,717,289 A | * | 2/1998 | Tanaka | 313/503 |
| 5,757,026 A | * | 5/1998 | Forrest et al. | 257/40 |
| 6,008,578 A | * | 12/1999 | Chen | 313/506 |
| 6,037,190 A | * | 3/2000 | Chao et al. | 438/35 |
| 6,284,342 B1 | * | 9/2001 | Ebisawa et al. | 428/69 |
| 2003/0116719 A1 | * | 6/2003 | Miyazawa | 250/484.2 |

* cited by examiner

Primary Examiner—Long Pham
(74) Attorney, Agent, or Firm—Rosenberg, Klein & Lee

(57) ABSTRACT

A white light emitting organic electro-luminescent (EL) device and a method for fabricating the same are provided. The device comprises: a substrate; a bottom electrode formed on a top surface of the substrate; at least an organic layer comprising an organic emitting layer formed on a surface of the bottom electrode to emit a first-color light; at least a transparent opposed electrode formed on a surface of the organic layer; and a sealing cap layer covering the organic layer and the transparent opposed electrode, wherein a color conversion layer is disposed on an inner surface of the sealing cap layer for converting a percentage of the first-color light into a second-color light and a third-color light. Therefore, a white light source is achieved by mixing the three primary colors.

9 Claims, 3 Drawing Sheets

WHITE LIGHT EMITTING ORGANIC ELECTRO-LUMINESCENT DEVICE AND METHOD FOR FABRICATING THE SAME

BACKGROUND OF THE INVENTION

1. Field of the Invention

The present invention generally relates to an organic electro-luminescent (EL) device (also known as OELD) and a method for fabricating the same, and more particularly to a white light emitting organic EL device able to directly emit a continuous full-color light providing three different frequency bands and a method for fabricating such an organic electro-luminescent device.

2. Description of the Prior Art

The organic electro-luminescent device has attracted tremendous attention due to its advantages over other display panels. These advantages include self-luminescence, large visual angle, short response time, compact size, light weight, reduced dimension in thickness, high brightness, low power consumption, simple fabrication, and the ability for light emitting in a full-color range. Therefore, such an organic electro-luminescent device is increasingly required to replace the currently used white light sources such as fluorescent lamps and light bulbs to save energy, and the technologies thereof have widely been studied in the industry all over the world.

Please refer to FIG. 1, which is a cross-sectional view showing the structure of a conventional organic EL device in accordance with the prior art. The organic EL device is characterized in that a bottom electrode 13 is formed on a substrate 11, and on the bottom electrode 13 there are formed an organic layer 15 comprising a hole injection layer, a hole transport layer, an organic emitting layer or an electron transport layer, an opposed electrode 17 and an sealing cap layer 19 by evaporation in turn. Due to the limitation of the material used in the organic layer 15, such a device as described in FIG. 1 is only able to emit monochromatic lights, preferably blue, red, or green according to various chosen fluorescent materials, and fail to achieve the object of emitting a white light or continuous full-color light. Therefore, several modifications have to be made on the device structure to obtain a white light source.

For example, Forrest et al. (The Trustees of Princeton University, Princeton, N.J.) discloses "Multicolor organic light emitting devices" as U.S. Pat. No. 5,757,026 and Chao, et al. (Industrial Technology Research Institute, Hsinchu, TW) discloses "Method for fabricating an organic electro-luminescent device" as U.S. Pat. No. 6,037,190. Please refer to FIG. 2, which is a cross-sectional view showing the structure of a conventional white light emitting organic EL device similar to the organic EL device disclosed in U.S. Pat. No. 6,037,190. In FIG. 2, the white light emitting organic EL device is characterized in that three organic layers 25G, 25R and 25B for emitting a green light, a red light and a blue light, respectively, are interposed between the bottom electrode 13 and a corresponding opposed electrode 17. Therefore, a white light source is obtained by mixing the lights from the three organic layers.

Nevertheless, there exist some problems in the aforementioned white light emitting organic EL device, in that:

(1) the organic material for emitting a red light has a shorter lifetime than other organic materials, which makes the white light emitting organic EL device mal-functional because the organic material for emitting a red light has failed;

(2) the manufacturing processing for forming different organic layers on a chip is difficult to carry out; and (3) hardware,implementation is difficult because the voltages for activating different organic layers are different.

In order to avoid the problems resulting from the organic EL device in FIG. 2, there have been proposed a number of disclosures such as U.S. Pat. No. 6,008,578 "Full-color organic electro-luminescent device with spaced apart fluorescent areas" filed by Chen (Hsinchu, TW), U.S. Pat. No. 5,294,870 "Orgahic electro-luminescent multicolor image display device" filed by Tang, et al. (Eastman Kodak Company, Rochester, N.Y.) and U.S. Pat. No. 5,717,289 "Thin film electro-luminescent element easily regulating emitted light to white" filed by Tanaka (NEC Corporation, Tokyo, JP). Please refer to FIG. 3, which is a cross-sectional view showing the structure of a conventional white light emitting organic EL device similar to the thin film electro-luminescent element disclosed in U.S. Pat. No. 5,717,289. In FIG. 3, the white light emitting organic EL device is characterized in that a color conversion layer 30 is interposed between the bottom electrode 13 and the substrate 11. The color conversion layer 30 is formed of a fluorescent material. When a current is injected from the bottom electrode 13 into the opposed electrode 17, the organic layer 15 emits a blue light (B). As the blue light (B) passes through the color conversion layer 30, a certain percentage of the blue light (B) turns out to be red (R) and green (G). Therefore, a white light source is obtained.

However, as shown in FIG. 3, since the color conversion layer 30 is interposed between the bottom electrode 13 and the substrate 11, the flatness of the subsequent organic layer 15 is adversely affected and so is the lifetime of the organic layer 15.

Moreover, one modification of the structure shown in FIG. 3 is to form the color conversion layer 30 on the organic layer 15. In other words, the organic layer 15 is formed prior to the formation of the color conversion layer 30. As a result, the organic layer 15 may be damaged due to the high temperature as the color conversion layer 30 is formed by evaporation, leading poor full-color display quality.

Therefore, in view of the aforementioned problems, there is need in providing a white light emitting organic EL device and a method for fabricating such An organic EL device, resulting to simplify the fabrication processing and achieve longer lifetime as well as better full-color display quality of the device.

SUMMARY OF THE INVENTION

Therefore, it is the primary object of the present invention to provide a white light emitting organic electro-luminescent device and a method for fabricating such an organic EL device, employing a simplified fabricating processing to realize a white light source with better full-color quality and longer lifetime of the device.

It is another object of the present invention to provide a white light emitting organic electro-luminescent device and a method for fabricating such an organic EL device, employing a color conversion layer disposed on the inner surface of a scaling cap layer, resulting to simplify the fabrication processing and prevent the color conversion layer from being affected when an organic layer is formed, and vice versa.

It is still another object of the present invention to provide a white light emitting organic electro-luminescent device and a method for fabricating such an organic EL device, employing a transparent sealing cap layer such that the device emits lights of different colors on both sides of the device.

In order to achieve the foregoing objects, the present invention provides a white light emitting organic electro-luminescent device, comprising: a substrate; a bottom electrode formed on a top surface of said substrate; at least an organic layer comprising an organic emitting layer formed on a surface of said bottom electrode to emit a first-color light; at least a transparent opposed electrode formed on a surface of said organic layer; and a sealing cap layer covering said organic layer and said transparent opposed electrode, wherein a color conversion layer is disposed on an inner surface of said sealing cap layer for converting a percentage of said first-color light into a second-color light and a third-color light.

The present invention further provides a method for fabricating a white light emitting organic electro-luminescent device, comprising steps of: providing a substrate; forming a bottom electrode on a top surface of said substrate; forming an organic layer on a surface of said bottom electrode to emit a first-color light; forming an opposed electrode on a surface of said organic layer; and forming a color conversion layer for converting a percentage of said first-color light into a second-color light and a third-color light; wherein said sealing cap layer and said color conversion layer are fixedly disposed on said surface of said substrate, while said organic layer and said opposed electrode are enclosed in said sealing cap layer.

Other and further features, advantages and benefits of the invention will become apparent in the following description taken in conjunction with the following drawings. It is to be understood that the foregoing general description and following detailed description are exemplary and explanatory but are not to be restrictive of the invention. The accompanying drawings are incorporated in and constitute a part of this application and, together with the description, serve to explain the principles of the invention in general terms. Like numerals refer to like parts throughout the disclosure.

BRIEF DESCRIPTION OF THE DRAWINGS

The objects, spirits and advantages of the preferred embodiment of the present invention will be readily understood by the accompanying drawings and detailed descriptions, wherein.

DETAILED DESCRIPTION OF THE INVENTION

The present invention providing a white light emitting organic electro-luminescent (EL) device and a method for fabricating such a device can be exemplified by the preferred embodiment as described hereinafter.

Figure 4:
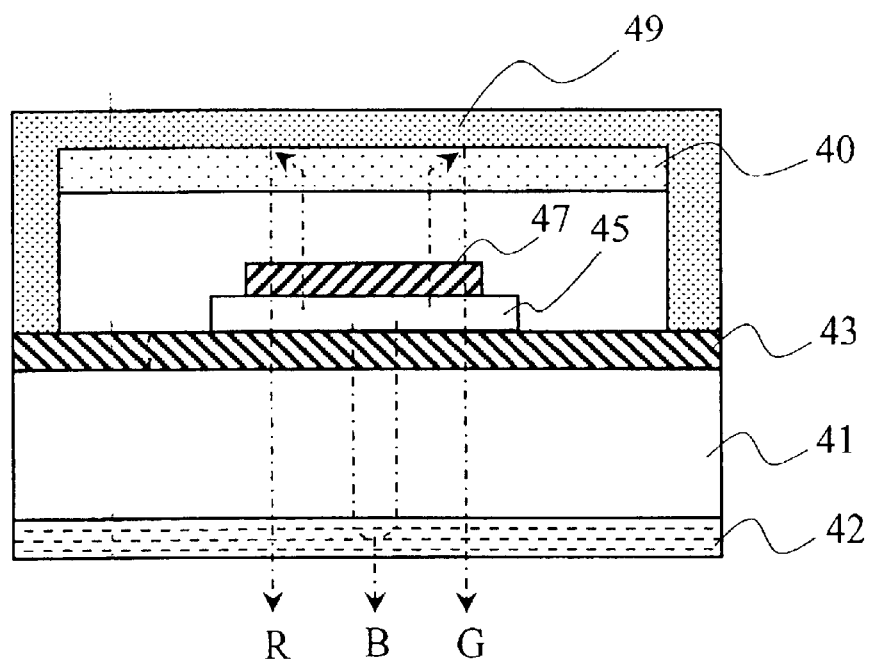
FIG. 4 is a cross-sectional view showing the structure of a white light emitting organic EL device in accordance with one preferred embodiment of the present invention.

To start with, please refer to FIG. 4, which is a cross-sectional view showing the structure of a white light emitting organic EL device in accordance with one preferred embodiment of the present invention. As shown in the drawing, the white light emitting organic EL device comprises: a substrate 41; a bottom electrode 43 formed on a top surface of the substrate 41; an organic layer 45 comprising at least an organic emitting layer; and an opposed electrode 47. These elements are formed in the same method as the method for fabricating a conventional white light emitting organic EL. However, the present invention is characterized in that a sealing cap layer 49 is formed by evaporation on the substrate 41 after a color conversion layer 40 is formed of a fluorescent material on the inner surface of the sealing cap layer 49. The color conversion layer 40 and the sealing cap layer 49 are fixedly disposed on the substrate 41 such that an organic EL device is completed. When a current is injected from the bottom electrode 43 into the opposed electrode 47, the organic layer 45 emits a first-color light (a blue light (B) in the present embodiment). As a certain percentage of the blue light (B) passes through the opposed electrode 47 and reaches the color conversion layer 40, part of the blue light (B) turns out to be a second-color (red (R)) light and a third-color (green (G)) light. The red (R) light and the green (G) light reach the sealing cap layer 49 and are reflected to mix with the blue light (B). Therefore, a white light source is obtained.

More particularly, the blue light (B) is directly emitted from the organic layer 45 towards the substrate 41, resulting in a shorter optical path than the red light (R) and the green light (G). Therefore, a color filter 42 can be provided on the bottom surface of the substrate to attenuate the light intensity of the blue light such that an improved white light display quality is obtained. Certainly, in the present embodiment, the bottom electrode 43 and the opposed electrode 47 are formed of transparent materials. Furthermore, the color conversion layer 40 is formed on the inner surface of the sealing cap layer 49 before the sealing cap layer 49 is formed in the substrate, such that the color conversion layer is prevented from being affected when an organic layer is formed, and vice versa.

Figure 5:
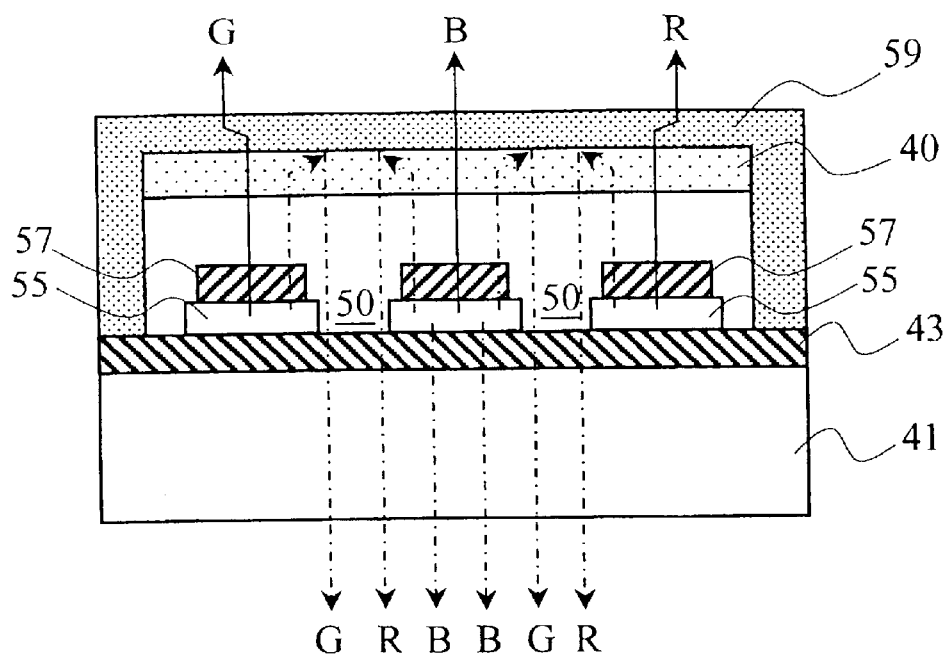
FIG. 5 is a cross-sectional view showing the structure of another white light emitting organic EL device in accordance with another embodiment of the present invention.

Furthermore, please refer to FIG. 5, which is a cross-sectional view showing the structure of another white light emitting organic EL device in accordance with another embodiment of the present invention. The present embodiment is for the purpose of overcoming the problem that the blue light (B) has a relatively stronger intensity than the red light (R) and the green light (G). As shown in FIG. 5, the white light emitting organic EL device comprises: a substrate 41; a bottom electrode 43 formed on a top surface of the substrate 41; and a sealing cap layer 59, in which are provided a plurality of organic layers 55 each comprising at least an organic emitting layer and a plurality of opposed electrode 57. Therefore, a gap 50 is formed between every two organic layers 55 to reduce the light intensity of the blue light (B). Since the organic layers 55 emit light in all directions, the light intensities of the red light (R) and the green light (G) obtained by reflecting the blue light (B) by the color conversion layer 40 are relatively less reduced. Therefore, a white light emitting organic EL device with good full-color display quality is obtained.

Moreover, in the present embodiment, if the sealing cap layer 59 is formed of a transparent material, the white light obtained by mixing up the blue light (B), the red light (R) and the green light (G) is emitted through the sealing cap layer 59, as indicated by the arrow. In this case, the opposed electrode 43 and the substrate 41 are not necessarily formed of transparent materials.

Figure 1:
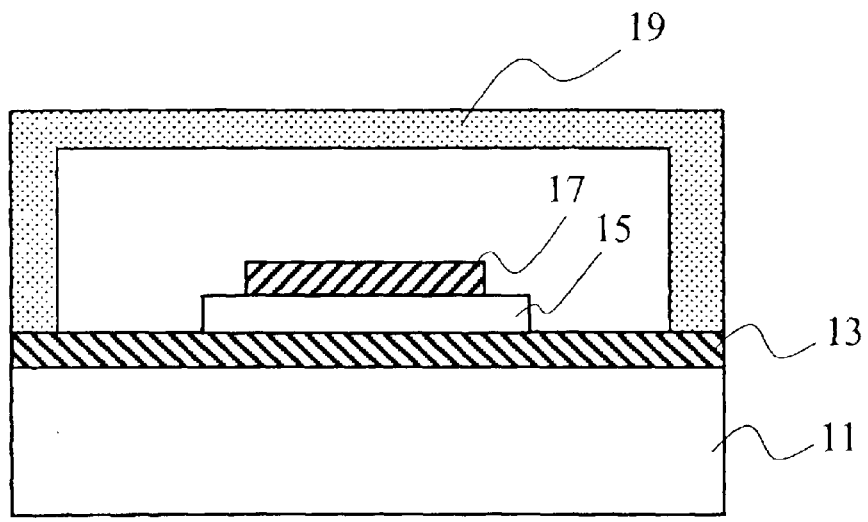
FIG. 1 is a cross-sectional view showing the structure of a conventional organic EL device in accordance with the prior art.
Figure 2:
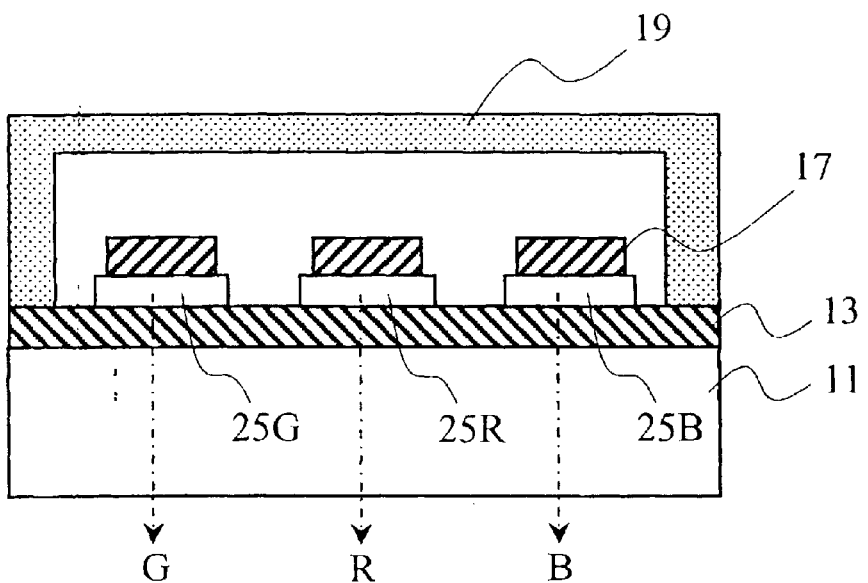
FIG. 2 is a cross-sectional view showing the structure of a conventional while light emitting organic EL device in accordance with the prior art.
Figure 3:
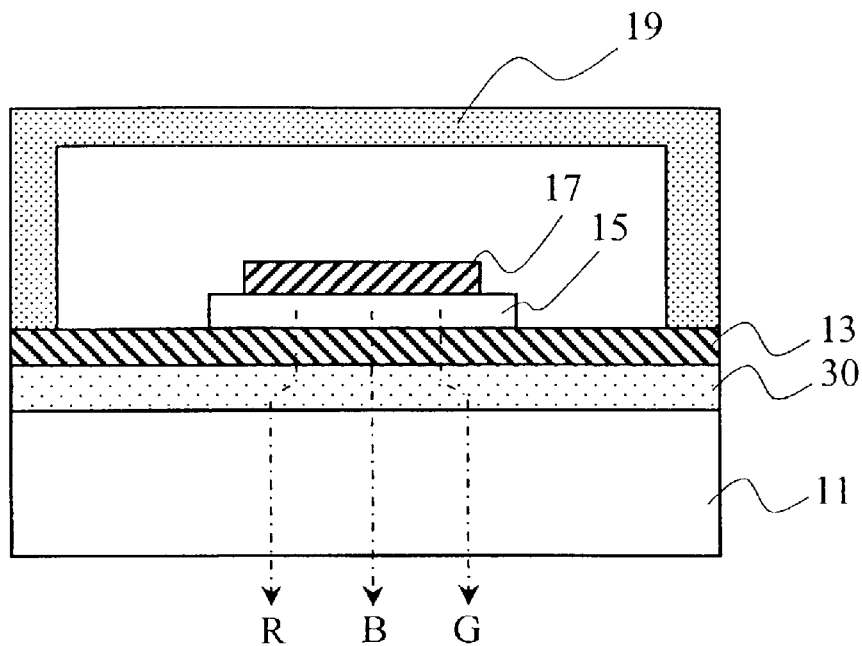
FIG. 3 is a cross-sectional view showing the structure of another conventional white light emitting organic EL device in accordance with the prior art.
Figure 6:
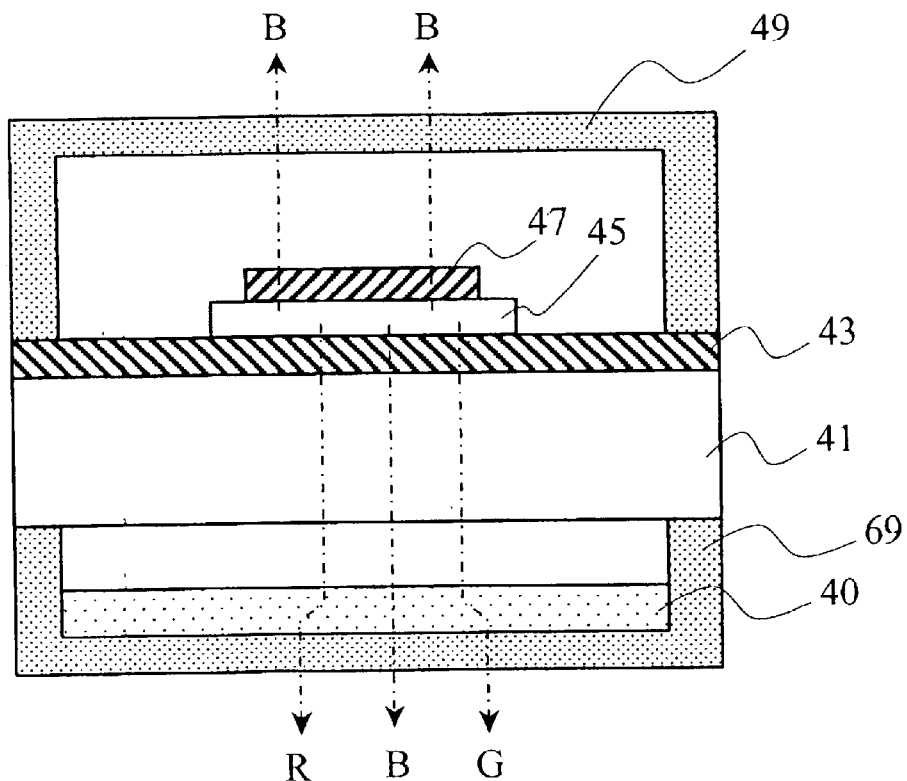
FIG. 6 is a cross-sectional view showing the structure of still another white light emitting organic EL device in accordance with still another embodiment of the present invention.

At last, please also refer to FIG. 6, which is a cross-sectional view showing the structure of still another white light emitting organic EL device in accordance with still another embodiment of the present invention. As shown in FIG. 6, the organic EL device is identical to that in FIG. 1 except for a bottom sealing cap layer 69 formed of a transparent material on the bottom surface of the substrate 41. A color conversion layer 40 is formed on the inner surface of the bottom sealing cap layer 69 before the bottom sealing cap layer 69 is formed. Therefore, a white light source is achieved by mixing the blue light (B) from the organic layer 45 with the red light (R) and the green light (G) from the color conversion layer 40.

In the present embodiment, if the top sealing cap layer 49 and the opposed electrode 47 are formed of transparent materials, the blue light (b) can be emitted from the organic layer 45 through the top sealing cap layer 49.

According to the above discussion, the present invention discloses a white light emitting organic electro-luminescent (EL) device and a method for fabricating the same, resulting to simply the fabrication processing, improve the full-color display quality and the lifetime of the device. Therefore, the present invention has been examined to be novel, non-obvious and useful.

Although this invention has been disclosed and illustrated with reference to particular embodiments, the principles involved are susceptible for use in numerous other embodiments that will be apparent to persons skilled in the art. This invention is, therefore, to be limited only as indicated by the scope of the appended claims.

What is claimed is:

1. A white light emitting organic electro-luminescent (EL) device comprising:
   a substrate;
   a bottom electrode formed on a top surface of said substrate;
   at least an organic layer comprising an organic emitting layer formed on a surface of said bottom electrode to emit a first-color light;
   at least a transparent opposed electrode formed on a surface of said organic layer; and
   a sealing cap layer covering said organic layer and said transparent opposed electrode, wherein a color conversion layer is disposed on an inner surface of said sealing cap layer for converting a percentage of said first-color light into a second-color light and a third-color light.

2. The white light emitting organic EL device as recited in claim 1, wherein said bottom electrode is formed of a transparent material.

3. The white light emitting organic EL device as recited in claim 2, further comprising a color filter on the bottom surface of said substrate.

4. The white light emitting organic EL device as recited in claim 1, wherein said sealing cap layer is formed of a transparent material.

5. The white light emitting organic EL device as recited in claim 1, wherein a gap is disposed between every two organic layers among a plurality of organic layers inside said sealing cap layer.

6. The white light emitting organic EL device as recited in claim 1, wherein said first-color light is blue.

7. A white light emitting organic electro-luminescent (EL) device, comprising:
   a substrate;
   a bottom electrode formed on a top surface of said substrate;
   at least an organic layer comprising an organic emitting layer formed on a surface of said bottom electrode to emit a first-color light;
   at least an opposed electrode formed on a surface of said organic layer;
   a sealing cap layer covering said organic layer and said opposed layer; and
   a transparent bottom sealing cap layer interposed on the bottom surface of said substrate, wherein a color conversion layer is disposed on an inner surface of said transparent bottom sealing cap layer for converting a percentage of said first-color light into a second-color light and a third-color light.

8. The white light emitting organic EL device as recited in claim 7, wherein said sealing cap layer and said opposed electrode are formed of transparent materials such that said white light emitting organic EL device emits said first-color light through said sealing cap layer and said opposed electrode.

9. The white light emitting organic EL device as recited in claim 7, wherein said first-color light is blue.

* * * * *